United States Patent
Rachmady et al.

(10) Patent No.: US 10,644,137 B2
(45) Date of Patent: May 5, 2020

(54) III-V FINFET TRANSISTOR WITH V-GROOVE S/D PROFILE FOR IMPROVED ACCESS RESISTANCE

(71) Applicant: Intel Corporation, Santa Clara, CA (US)

(72) Inventors: Willy Rachmady, Beaverton, OR (US); Matthew V. Metz, Portland, OR (US); Gilbert Dewey, Hillsboro, OR (US); Sean T. Ma, Portland, OR (US); Chandra S. Mohapatra, Beaverton, OR (US); Sanaz K. Gardner, Portland, OR (US); Jack T. Kavalieros, Portland, OR (US); Anand S. Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/099,418

(22) PCT Filed: Jul. 2, 2016

(86) PCT No.: PCT/US2016/040899
§ 371 (c)(1),
(2) Date: Nov. 6, 2018

(87) PCT Pub. No.: WO2018/009161
PCT Pub. Date: Jan. 11, 2018

(65) Prior Publication Data
US 2019/0148512 A1    May 16, 2019

(51) Int. Cl.
*H01L 29/66* (2006.01)
*H01L 21/02* (2006.01)
(Continued)

(52) U.S. Cl.
CPC ...... *H01L 29/6681* (2013.01); *H01L 21/0245* (2013.01); *H01L 21/02546* (2013.01);
(Continued)

(58) Field of Classification Search
CPC ......... H01L 21/76816; H01L 21/78696; H01L 21/823418; H01L 21/823431;
(Continued)

(56) References Cited

U.S. PATENT DOCUMENTS 9,147,682 B2 *  9/2015  Ching ............. H01L 21/823821
2007/0102756 A1  5/2007  Lojek
(Continued)

FOREIGN PATENT DOCUMENTS

WO    WO-2015-147858    10/2015

OTHER PUBLICATIONS

International Search Report and Written Opinion for International Patent Application No. PCT/US2016/040899 dated Apr. 26, 2017, 14 pgs.

*Primary Examiner* — David C Spalla
(74) *Attorney, Agent, or Firm* — Schwabe, Williamson & Wyatt, P.C.

(57) ABSTRACT

An apparatus including a transistor device including a body including a channel region between a source region and a drain region; and a gate stack on the body in the channel region, wherein at least one of the source region and the drain region of the body include a contact surface between opposing sidewalls and the contact surface includes a profile such that a height dimension of the contact surface is greater at the sidewalls than at a point between the sidewalls. A method including forming a transistor device body on a circuit substrate, the transistor device body dimension defining a channel region between a source region and a drain region; forming a groove in the body in at least one of the
(Continued)

source region and the drain region; and forming a gate stack on the body in the channel region.

21 Claims, 10 Drawing Sheets

(51) Int. Cl.
*H01L 21/768* (2006.01)
*H01L 21/8234* (2006.01)
*H01L 27/088* (2006.01)
*H01L 29/417* (2006.01)
*H01L 29/78* (2006.01)

(52) U.S. Cl.
CPC ............ *H01L 21/76816* (2013.01); *H01L 21/823418* (2013.01); *H01L 21/823431* (2013.01); *H01L 27/0886* (2013.01); *H01L 29/41791* (2013.01); *H01L 29/66545* (2013.01); *H01L 29/66795* (2013.01); *H01L 29/785* (2013.01); *H01L 29/7851* (2013.01)

(58) Field of Classification Search
CPC ........... H01L 27/0886; H01L 29/41791; H01L 29/66795; H01L 29/785; H01L 29/7851
See application file for complete search history.

(56) References Cited

U.S. PATENT DOCUMENTS

| | | | |
|---|---|---|---|
| 2009/0026530 A1 | 1/2009 | Wilson et al. | |
| 2012/0273850 A1 | 11/2012 | Chun | |
| 2014/0008699 A1* | 1/2014 | Oxland | H01L 29/45 257/192 |
| 2014/0284726 A1* | 9/2014 | Lee | H01L 27/0886 257/401 |
| 2015/0332972 A1* | 11/2015 | Wu | H01L 21/02529 438/275 |
| 2016/0005656 A1 | 1/2016 | Ching et al. | |
| 2017/0012129 A1* | 1/2017 | Basker | H01L 29/7851 |
| 2017/0077228 A1* | 3/2017 | Lee | H01L 29/66795 |
| 2019/0259846 A1* | 8/2019 | Yang | H01L 21/263 |

\* cited by examiner

US 10,644,137 B2

III-V FINFET TRANSISTOR WITH V-GROOVE S/D PROFILE FOR IMPROVED ACCESS RESISTANCE

CROSS-REFERENCE TO RELATED APPLICATION

This patent application is a U.S. National Phase Application under 35 U.S.C. § 371 of International Application No. PCT/US2016/040899, filed Jul. 2, 2016, entitled "III-V FINFET TRANSISTOR WITH V-GROOVE S/D PROFILE FOR IMPROVED ACCESS RESISTANCE," which designates the United States of America, the entire disclosure of which is hereby incorporated by reference in its entirety and for all purposes.

BACKGROUND

Field

Integrated circuit devices.

Description of Related Art

Continued sealing of transistor devices both in device dimension and area density (pitch scaling) may reduce an area to be contacted in the source and drain. Reduced source/drain contact area may result in an increase in access resistance that can degrade device performance. Previous attempts to decrease access resistance include increasing doping in the source/drain and lowering a barrier height between a contact metal and semiconductor.

DETAILED DESCRIPTION

A technique to reduce an impact of contact resistance at the source and/or drain of a transistor device is described. The technique increases a surface area for a contact with a source and/or drain without having to increase transistor size or pitch. The technique enables integration on group III-V non-planar transistors (e.g., finfets) in ultra-scale dimensions and tight pitches.

Figure 1:
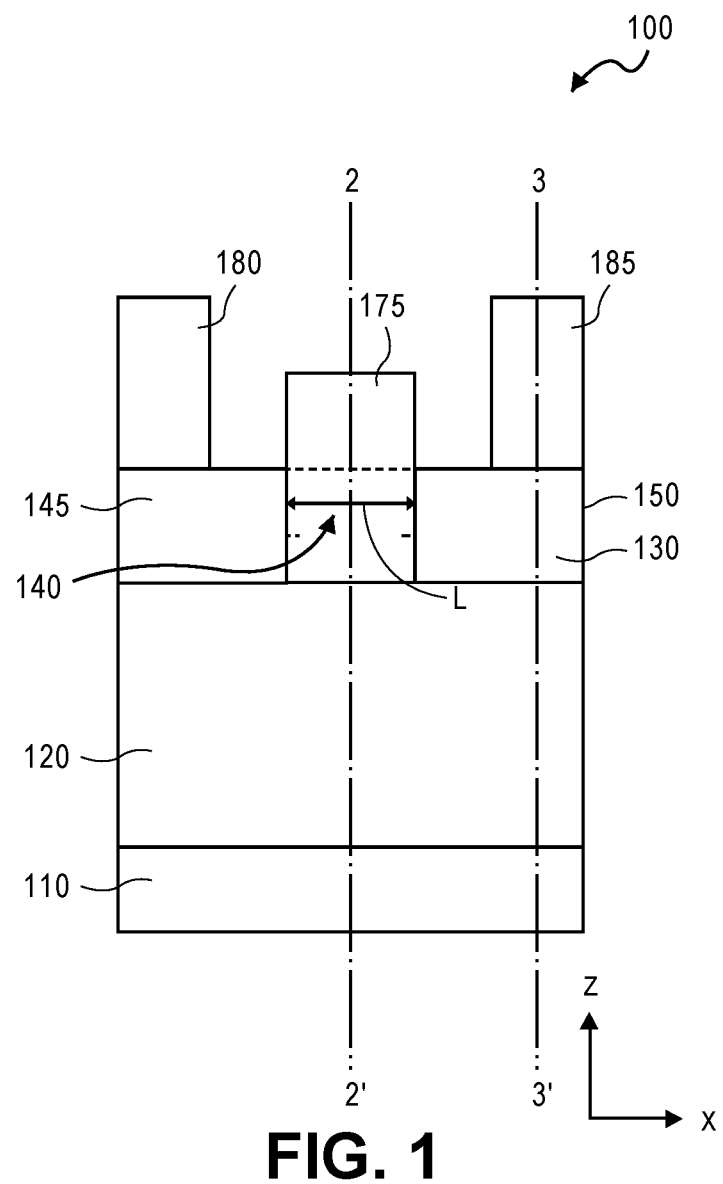
FIG. 1 shows a cross-sectional side view of an embodiment of a multigate field effect transistor device.
Figure 2:
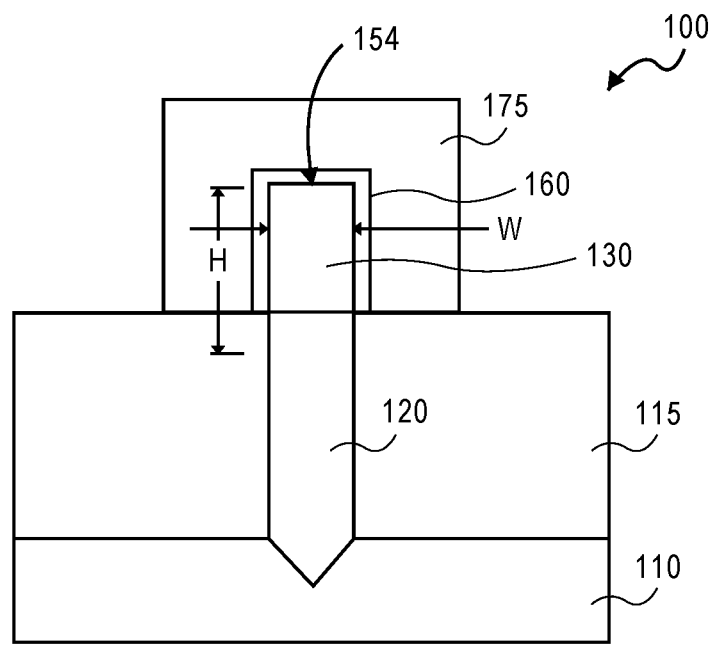
FIG. 2 shows a cross-sectional side view of the structure of FIG. 1 through line 2-2'.
Figure 3:
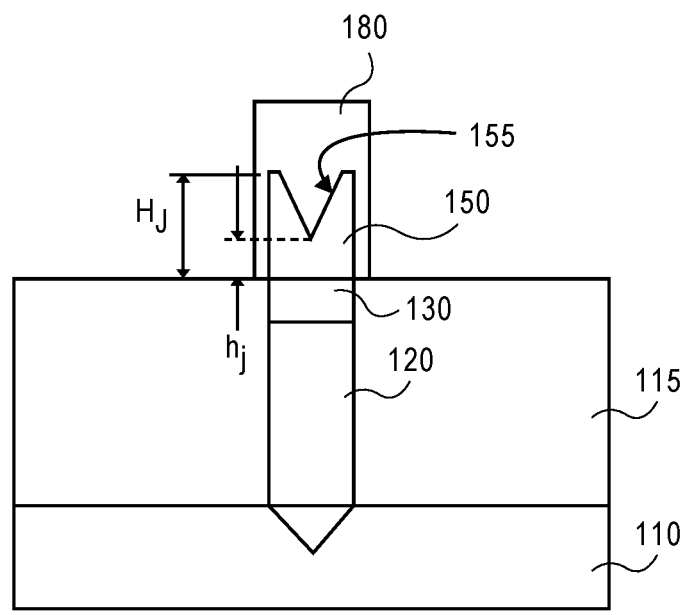
FIG. 3 shows a cross-sectional side view of the structure of FIG. 1 through line 3-3'.

FIG. 1 shows a cross-sectional side view of an embodiment of a field effect transistor (FET) device such as a metal oxide semiconductor field effect transistor (MOSFET) device, a tunneling field effect transistor (TFET) device or other FET device. FIG. 2 shows the structure of FIG. 1 through line 2-2'. FIG. 3 shows the structure of FIG. 2 through line 3-3'. In this embodiment, a non-planar multi-gate transistor is described. It is appreciated that the techniques described are applicable to other transistors including but not limited to planar and gate all-around devices.

Referring to FIG. 1, FIG. 2 and FIG. 3, device 100 includes substrate 110 that is, for example, a single crystal silicon substrate such as a bulk substrate or a silicon on insulator substrate. Disposed on substrate 110, in this embodiment, is buffer layer 120. Buffer layer 120 contains, for example, a material that has a larger lattice than a material of the substrate (e.g., silicon substrate 110). A suitable material for buffer layer includes but is not limited to indium phosphate (InP), germanium (Ge), gallium arsenide (GaAs), gallium phosphide (GaP), gallium arsenide antimony (GaAsSb), indium aluminum arsenide (InAlAs), indium aluminum antimony (InAlSb), or gallium antimony (GaSb). To reduce a threading dislocation density, a material in buffer layer 120 may be graded with, for example, a material of the underlying substrate (e.g., silicon) to gradually increase a material composition of buffer layer in an epitaxially grown film such that closer to substrate 110, a material concentration of buffer layer is less and increases away from the substrate. In another embodiment, two or more different materials may be present in buffer layer 120 such as a first material at the base of the buffer layer and a second material on the first material.

In the embodiment in FIGS. 1-3, disposed on buffer layer 120 is intrinsic layer 130. In one embodiment, intrinsic layer 130 is a channel material for the particular transistor device. In one embodiment, intrinsic layer 130 includes a group III-V compound material. In one embodiment, the group III-V compound material includes indium (In) (i.e., has a concentration of indium). An example of a group III-V compound material including indium, particularly for an n-type transistor device is InGaAs.

As illustrated in FIG. 1, disposed in intrinsic layer 130 is diffusion or junction region 145 and diffusion or junction region 150. In one embodiment, diffusion region 145 is a source of a MOSFET (e.g., an $n^+$ source) and diffusion region 150 is a drain of the MOSFET (e.g., $n^+$ drain). Disposed between diffusion regions 145 and 150 is channel 140 of a material of intrinsic layer 130 having a length dimension, L, of, for example, 10-30 nm.

As illustrated in FIG. 2, in one embodiment, intrinsic layer 130 is a body or fin having representative width dimension, W, defined by opposing sidewalls on the order of 5-20 nm and a representative height dimension on the order of 10 to 100 nm. As FIG. 2 is a cross-section through a channel region of the transistor of FIG. 1, FIG. 2 shows that the body of intrinsic layer 130 in this region has a generally rectangular profile including contact surface 154 defined as a surface between opposing sidewalls of the body or fin of intrinsic layer 130 that, in one embodiment, is substantially parallel to a surface of substrate 110. It is appreciated that a profile of the body of intrinsic layer will depend in part on the processing techniques (e.g., polish, etching, etc.) used to form the body. Accordingly, a body targeted to have a contact surface parallel to a device surface of substrate 110 may have a contact surface approximating a parallel surface.

Referring to FIG. 3, diffusion region or drain 150, in one embodiment, has contact surface 155 defined as a surface between the opposing sidewalls. As viewed in FIG. 3, contact surface 155 has a profile in an xy dimension such that a height dimension of the body of intrinsic layer 130 is greater at the sidewalls than at a point between the sidewalls. In one embodiment, contact surface 155 defines a groove, such as a groove having a shape of the letter V, between the opposing sidewalls such that a surface area of contact surface 155 is greater than a surface area defined by width dimension, w, without the groove. Representatively, contact surface 155 in the body or fin of intrinsic layer in diffusion region 150 (a drain) is greater than a contact surface 154 of the body in a channel region (compare FIG. 2 and FIG. 3).

Overlying intrinsic layer 130 in channel region 140 is gate dielectric layer 160 of, for example, a silicon dioxide or a dielectric material having a dielectric constant greater than silicon dioxide (a high-k material) or a combination of silicon dioxide and a high-k and a thickness on the order of a few nanometers. Gate dielectric layer 160 is disposed on sidewalls of a length dimension, L, of the body of intrinsic layer 130 exposed above dielectric layer 115 and on contact surface 154. Gate dielectric layer 160 conforms to the profile of intrinsic layer 130 along a length dimension of channel region 140 that is representatively shown in FIG. 1. Disposed on gate dielectric 160 is gate electrode 175 of, for example, an electrically conductive material such as a metal material (e.g., tantalum) or a silicide. For representative purposes, in one embodiment, gate electrode 175 has a total thickness on the order of 50-100 nm and dielectric layer 160 has a thickness of 1-15 nm.

FIG. 1 also shows metal contact 180 to diffusion region 145 and metal contact 185 to diffusion region 150. An additional contact may be formed to the gate stack to operate the device. A representative metal for the contacts is tungsten deposited by way of a chemical vapor deposition (CVD) process. FIG. 3 shows contact 185 to diffusion region 150 (drain). As illustrated, the contact material is disposed on opposing sidewalls of the body or fin of intrinsic layer 130 and on contact surface 155. The material conforms to the body (conforms to contact surface 155). By conforming to contact surface 155 that has a groove, a contact area between the drain and the contact metal is increased relative to a body without a groove.

Figure 4:
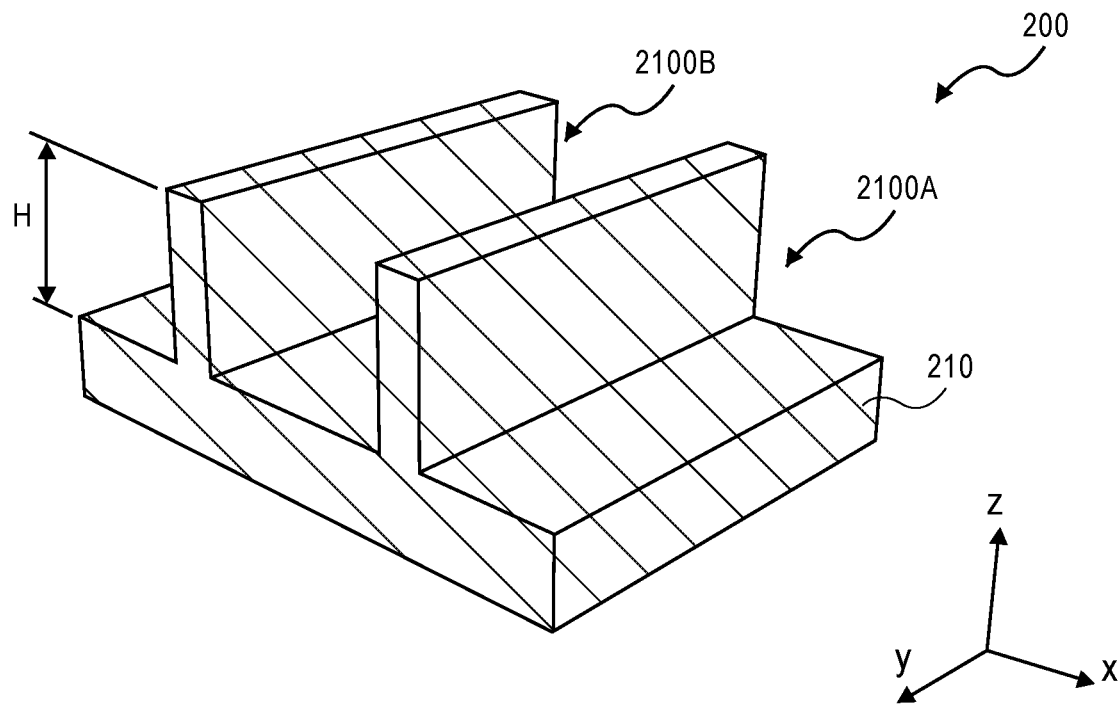
FIG. 4 shows a perspective side view of a substrate having sacrificial fins formed therein.

FIGS. 4-11 describe a process of forming an FET device such as is illustrated in FIGS. 1-3. FIG. 12 presents a flow chart of the process. FIGS. 4-11 describe a three-dimensional multigate FET including a fin comprising a contact surface having a profile with increased surface area of the contact surface of the fin with a gate stack relative to a planar contact surface. A formation process for an N-type FET is described. Referring to FIG. 4 and with reference to the flow chart of FIG. 12, the process begins by defining sacrificial fin structures in a substrate material (block 310, FIG. 12). FIG. 4 shows a perspective side view of substrate 210 that may be any material that may serve as a foundation of which a multigate FET may be constructed. Representatively, substrate 210 is a portion of a larger substrate such as wafer. In one embodiment, substrate 210 is a semiconductor material such as single crystal silicon. Substrate 210 may be a bulk substrate or, in another embodiment, a semiconductor on insulator (SOI) structure. FIG. 4 shows substrate 210 following a patterning of the substrate to define sacrificial fin 2100A and sacrificial fin 2100B. Sacrificial fins 2100A and 2100B may be formed by a mask and etch process wherein a mask (e.g., a hard mask) is introduced on a surface (superior surface) of substrate 210 to protect areas of the substrate where the sacrificial fins will be defined and to provide openings in non-fin areas. Once the mask is patterned, substrate 210 may be etched to remove material in unprotected areas. A substrate of silicon may be etched with a wet or dry etch. Representatively, a suitable etchant is HF based chemistry. Sacrificial fins 2100A and 2100B are etched to have a height, H, on the order of 100-400 nm.

Figure 5:
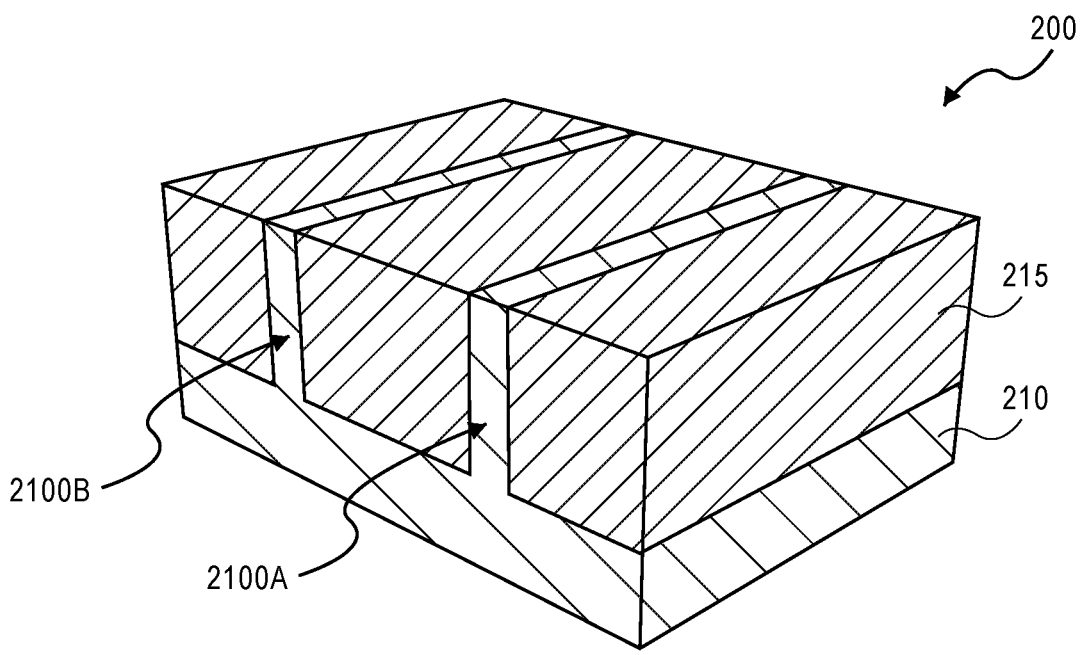
FIG. 5 shows the structure of FIG. 4 following a deposition of a trench dielectric layer on the substrate.

FIG. 5 shows the structure of FIG. 4 following a removal of the mask on the fins and following the deposition of a trench dielectric layer on the substrate (block 320, FIG. 12). In one embodiment, dielectric layer 215 is silicon dioxide or a low-k dielectric material. Following deposition of dielectric layer 215, the surface (a superior surface as viewed) of the structure is polished to the level of the top of sacrificial fins 2100A and 2100B so that the fins are exposed.

Figure 6:
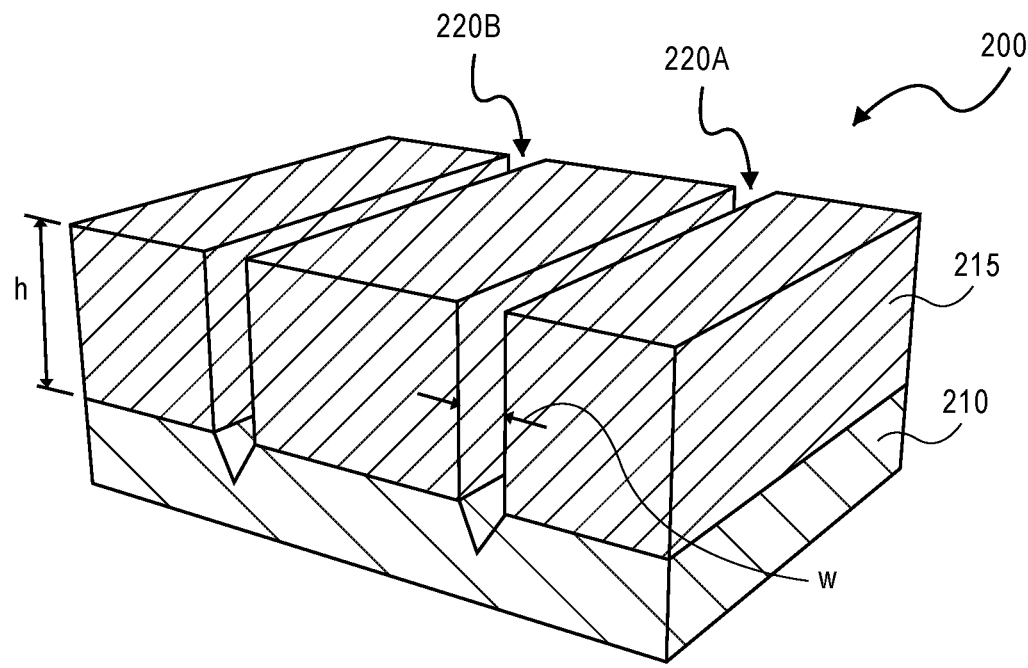
FIG. 6 shows the structure of FIG. 4 following the removal of the sacrificial fins to form trenches of a controlled size and shape.

FIG. 6 shows the structure of FIG. 5 following the removal of sacrificial fins 2100A and 2100B to form trenches of a controlled size and shape (block 330, FIG. 12). The sacrificial fins may be removed by mask and etch process wherein a mask is patterned on a surface of dielectric layer 215 leaving the sacrificial fins exposed followed by an etch process. Sacrificial fins of a silicon material may be etched by a dry or wet etch or a combination of the two. Suitable etchants for etching sacrificial fins of a silicon material include potassium hydroxide (KOH) and tetramethylammonium hydroxide (TMAH). The removal of the sacrificial fins forms trench 220A and trench 220B, respectively. In one embodiment, the etching of the sacrificial fins may be performed to provide a {111} faceting at the bottom of each trench to facilitate a growth of a group III-V compound material in the trenches which is done using TMAH-like or any equivalent chemistry. Alternative geometries are also contemplated. The trench confined growth of materials offer an advantage of aspect ratio trapping (ART) whereby crystalline quality of the epitaxial layer is enhanced through trapping of threading dislocations, stacking faults, twins, etc., at sidewalls of trench 218 where defects terminate such that overlying layers may be increasingly defect-free. In one embodiment, to achieve ART, trench 218 has dimensions such that its height, h, is on the order of twice its width, w.

Figure 7:
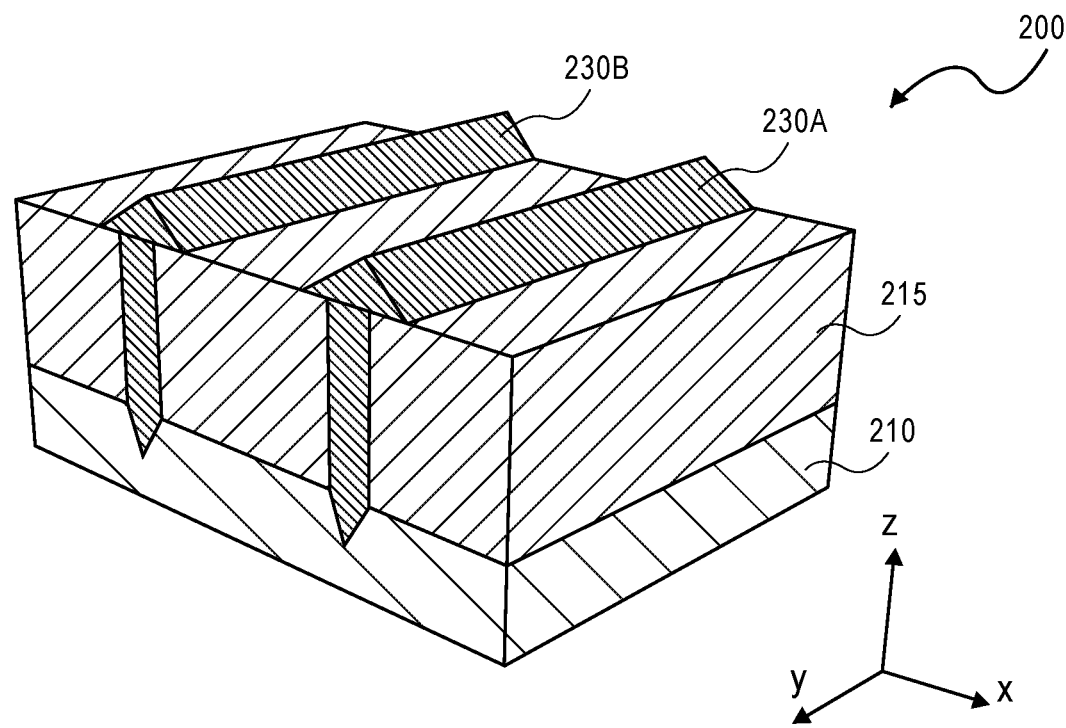
FIG. 7 shows the structure of FIG. 5 following the introduction of a buffer material in the trenches.

FIG. 7 shows the structure of FIG. 5 following the introduction of a buffer material in trenches 220A and 220B (block 340, FIG. 12). In one embodiment, buffer material is a group III-V compound material such as, but not limited to, gallium arsenide (GaAs), indium phosphide (InP); germanium (Ge), gallium phosphide (GaP), gallium arsenide antimony (GaAsSb), indium aluminum arsenide (InAlAs) and gallium antimony (GaSb). The buffer material may be introduced by an epitaxial growth process. In another embodiment, the trenches may be filled with a first buffer of one of the noted materials followed by a second buffer of another of the noted materials. FIG. 7 shows buffer material 230A and buffer material 230B in respective trenches 220A and 220B. FIG. 7 shows buffer material 230A and buffer material 230B representatively including {111} faceted overgrowth protruding off the superior plane defined by a surface dielectric layer 215.

Figure 8:
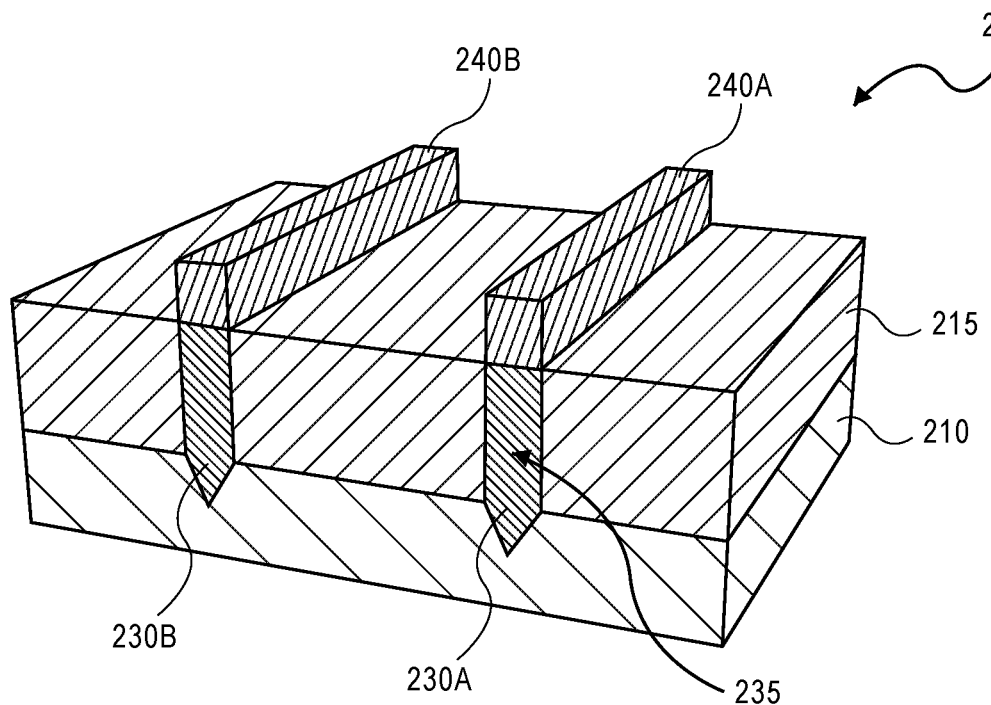
FIG. 8 shows the structure of FIG. 6 following a removal of a portion of the buffer material in respective trenches and the introduction of an intrinsic material into the trenches.

FIG. 8 shows the structure of FIG. 7 following a removal of a portion of buffer material 230A and buffer material 230B in their respective trenches and the introduction of an intrinsic material into the trenches. In one embodiment, the removal of buffer material 230A and buffer material 230B is performed by an initial chemical mechanical polish (CMP)

to planarize the buffer material with the superior plane defined by a surface of dielectric layer 215. Buffer material 230A and buffer material 230B are subsequently recessed in respective trenches 220B and 220B by a wet or dry etch process. A suitable etchant for etching a buffer material of InP is hydrochloric acid solution. FIG. 8 shows intrinsic layer 240A and intrinsic layer 240B formed on buffer material 230A and buffer material 230B, respectively (block 345, FIG. 12). The intrinsic layers may be epitaxially grown. In one embodiment, intrinsic layer 240A and intrinsic layer 240B are each an indium-containing group III-V compound material that may be lightly doped n-type or p-type to the extent of, for example, 1E16 atoms per cubic centimeters. In one embodiment, intrinsic layer 240A and intrinsic layer 240B are InGaAs. Intrinsic layer 240A and intrinsic layer 240B have a representative height on the order of 40 nm to 100 nm. FIG. 8 shows the structure following a polish of the intrinsic layer to a plane defined by dielectric layer 215 and after a recession of dielectric layer 215 such that the intrinsic layers are protruding above a plane defined by dielectric layer 215 as fin structures (block 350, FIG. 12).

Figure 9:
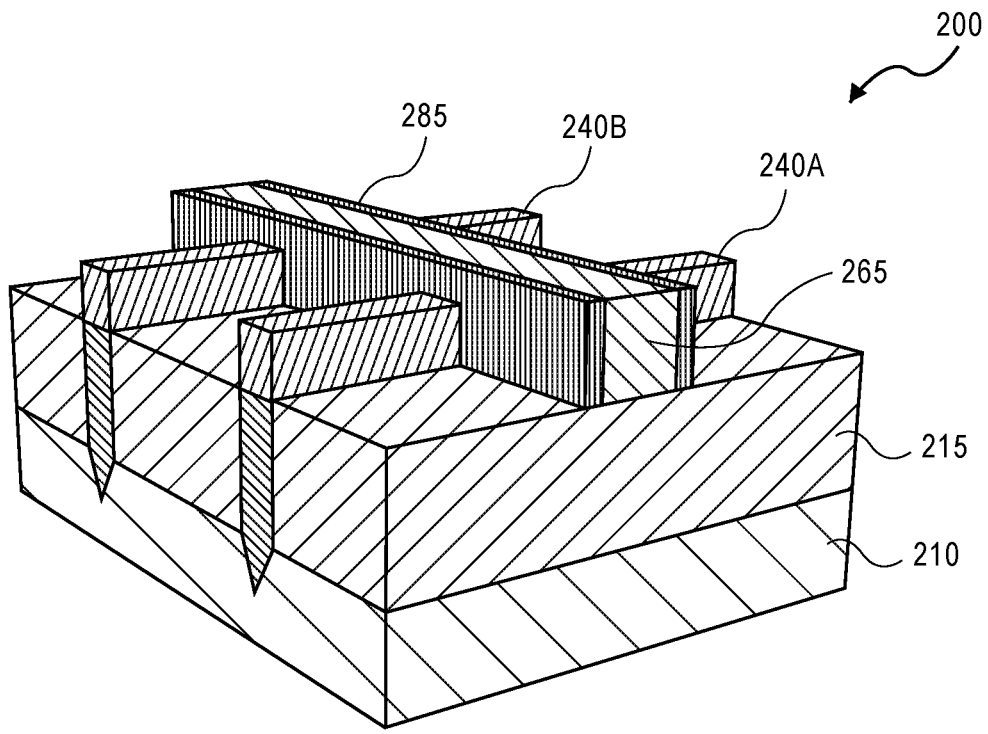
FIG. 9 shows the structure of FIG. 7 following the formation of a sacrificial or dummy gate stack on the fin portion of the intrinsic layers extending above dielectric layer 215.

FIG. 9 shows the structure of FIG. 8 following the formation of a sacrificial or dummy gate stack on the fin portion of intrinsic layer 240A and intrinsic layer 240B extending above dielectric layer 215 (block 360, FIG. 12). In one embodiment, a gate stack includes a gate dielectric layer of, for example, silicon dioxide or a high K dielectric material. Disposed on the gate dielectric layer, in one embodiment, is dummy gate 265 of, for example, polysilicon deposited by, for example, a chemical vapor deposition method. In one embodiment, to form the gate stack, a mask material is introduced over the structure and patterned to have an opening for the gate stack. The gate stack is then introduced in the opening in a typical gate-last process. The gate stack may include a spacer dielectric layer defining spacers 285 on opposite sides thereof.

Figure 10:
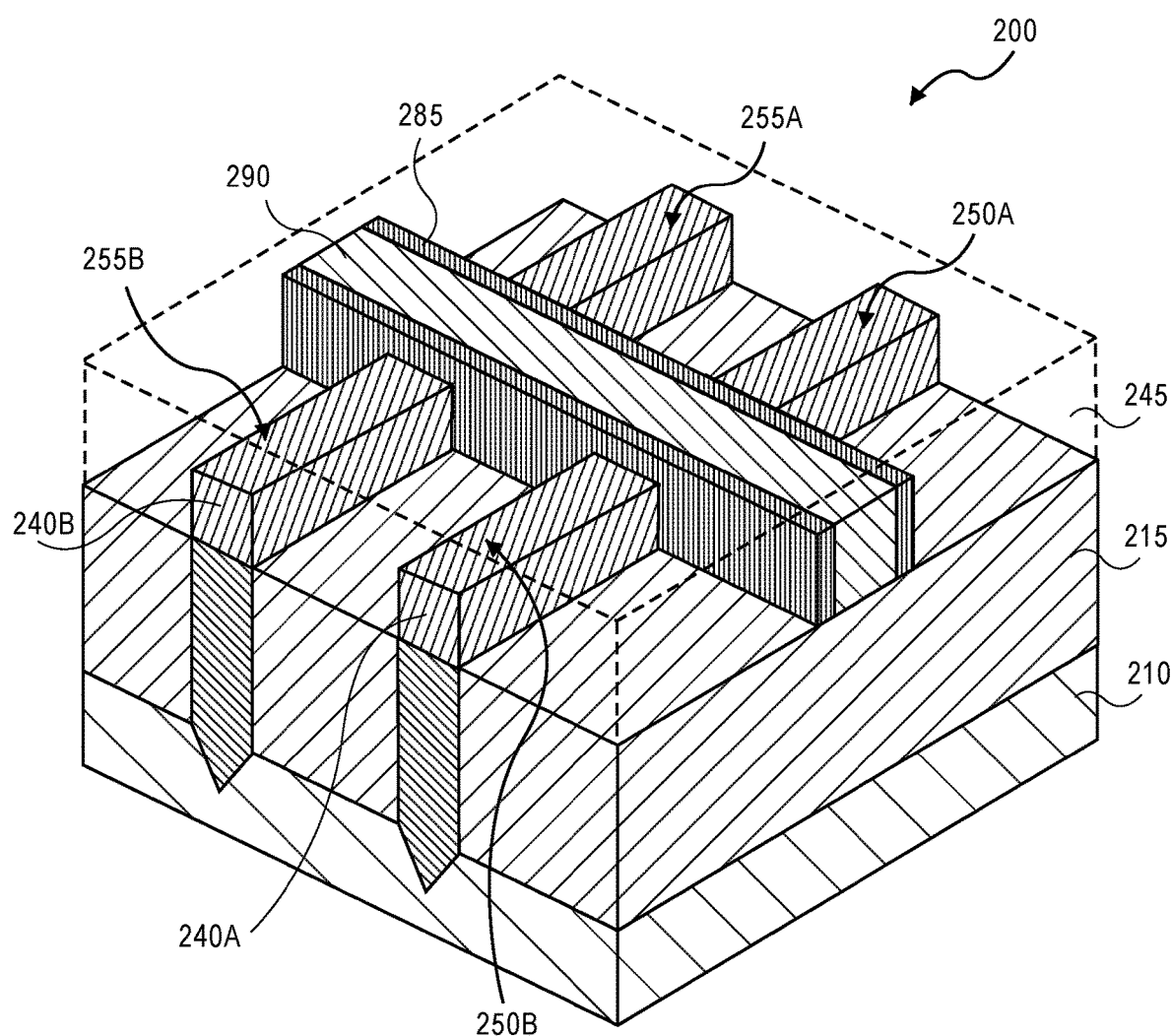
FIG. 10 shows the structure of FIG. 9 following the formation of a gate stack on channel regions of the fins.

FIG. 10 shows the structure of FIG. 9 following the definition of junction regions and a gate stack. FIG. 10 shows structure 200 including junction region or source (250A and junction region or drain 250B for one device and source 255A and drain 255B for a second device). Representatively, the junction regions (source and drain) are defined, in one embodiment, of a material of intrinsic layer 240A and 240B (InGaAs) in designated source and drain regions on the opposite sides of the sacrificial or dummy gate 265 (block 365, FIG. 12). In another embodiment, the junction regions may be formed by doping of such fin portions.

Following formation of junction regions (source 250A/drain 250B and source 255A/drain 255B), a dielectric material is introduced on the structure (on structure 200 (on a surface including the junction region and sacrificial gate 265)). In one embodiment, the dielectric material silicon dioxide or a low k material or a combination of materials (e.g., multiple low k material of silicon dioxide and one or more low k materials). FIG. 10 shows dielectric material 245 in dashed lines. Sacrificial gate 265 and the gate dielectric are then removed and replaced with a gate dielectric followed by a gate electrode (block 385, FIG. 12). A suitable gate dielectric is silicon dioxide or a high-k dielectric material or a combination of silicon dioxide and a high-k dielectric material. FIG. 10 shows the structure including gate electrode 290. Representative materials for a metal gate electrode include tungsten, tantalum, titanium or a nitride, a metal alloy or another material.

Figure 11:
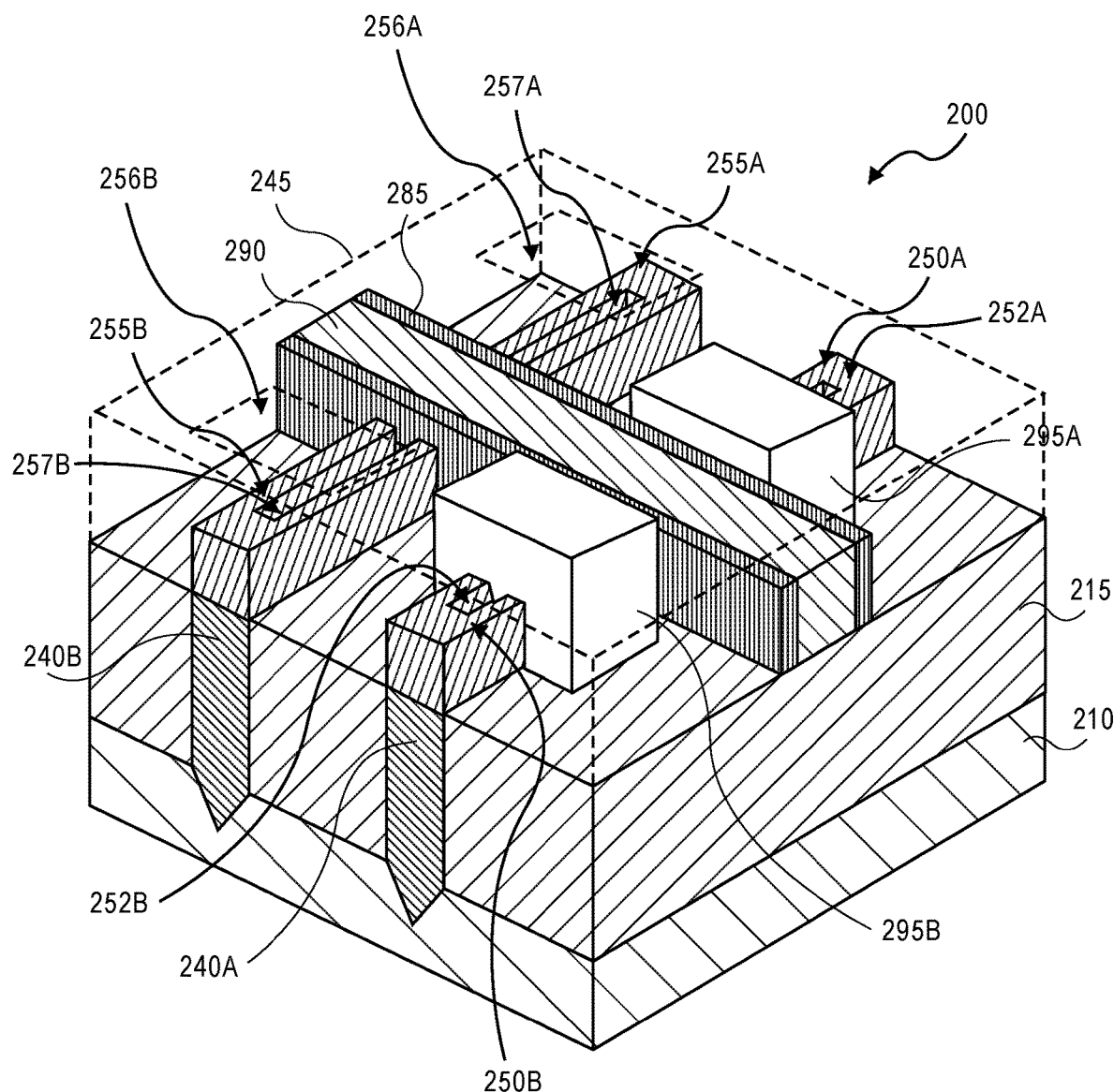
FIG. 11 shows the structure of FIG. 10 following the formation of grooves in the fin in areas designated for junction regions (source and drain) and the formation of contacts to a source and a drain.
Figure 12:
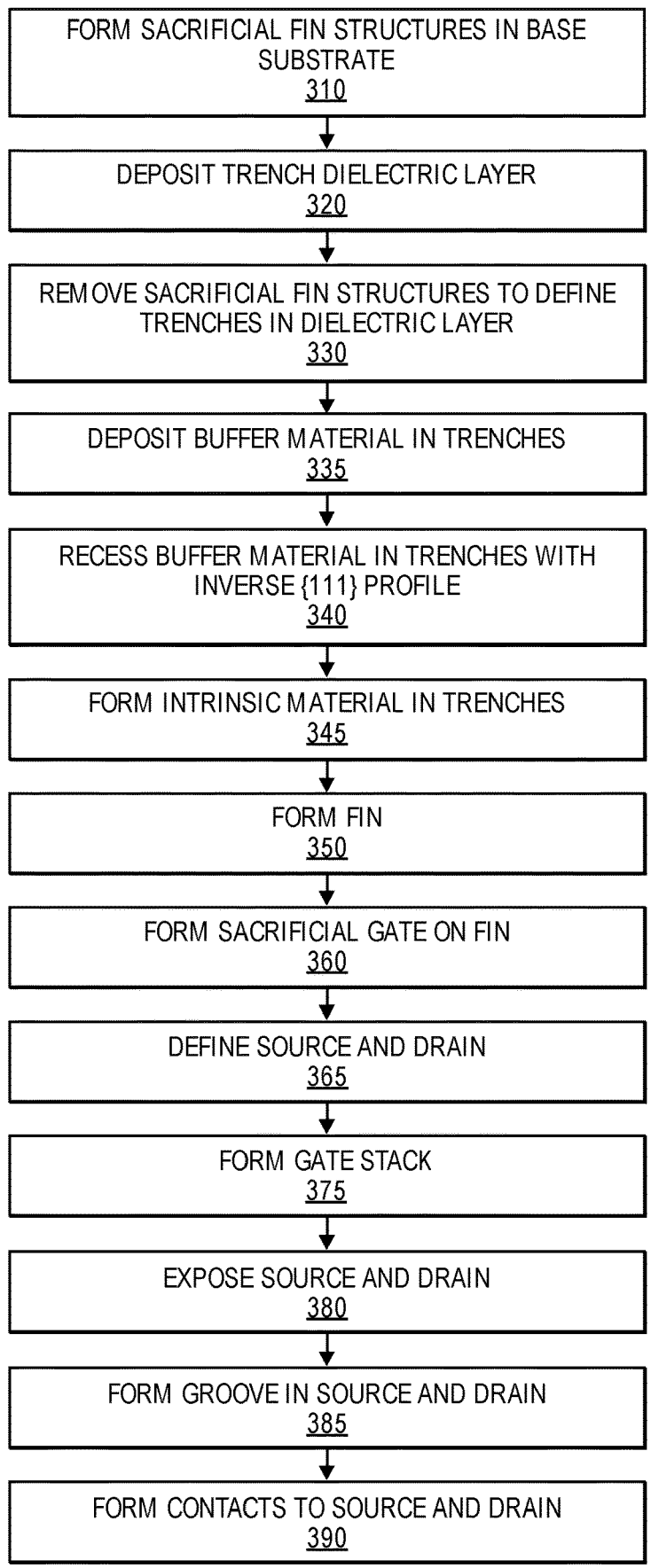
FIG. 12 presents a flow chart of the process.

FIG. 11 shows the structure of FIG. 10 following the exposure of diffusion junction regions (source 250A/drain 250B and source 255A/drain 255B) in dielectric layer 245 for contact formation to ones of the junction regions. The junction regions may be exposed by a mask and etch process (etching of dielectric layer 245). FIG. 11 shows portions of each of source 250A, drain 250B, source 255A and drain 255B exposed through dielectric layer 245. As will be described subsequently, in this illustration the openings through dielectric layer 245 to source 250A and drain 250B, respectively, are filled with contact material. Contact opening 256A in dielectric layer 245 to expose source 255A and contact opening 256B in dielectric layer 245 to expose drain 255B are not filled with contact material so that the respective source and drain may be illustrated. Following exposure of one or more junction regions and before the introduction of contact material, grooves are formed in the exposed one or more junction regions (block 385, FIG. 12). In one embodiment, an etch selective for a material for the fin in junction regions (e.g., selective for InGaAs) relative to dielectric material around the junction regions is applied to etch a core of the fin forming a groove or notch in the fin (between opposing sidewalls). In one embodiment, the groove has a shape of the letter V. An example of a suitable etchant for an InGaAs fin is a wet etch solution containing ammonium hydroxide and peroxide. FIG. 11 shows groove 252A in source 250A, groove 252B in drain 250B, groove 257A in source 255A and groove 257B in drain 255B. In one embodiment, each groove extends through a portion of a length dimension of the junction region (e.g., an entire length dimension or a portion of the length dimension exposed for a contact connection). Grooves 252A/252B and 257A/257B define a contact surface of the junction region (source/drain) for a subsequent contact that is greater than a contact surface of the junction region without the groove (a contact surface greater than a contact surface of the fin structure in a channel region). Following the formation of a groove in one or more junction regions, a contact of, for example, tungsten or other metal may be deposited on a respective junction region (block 390, FIG. 12). FIG. 11 shows contact 295A on (connected to) source 250A and contact 295B on drain 250B. Referring to contact 295B, it can be seen that a material of contact 295B conforms to a contact surface of drain 250B including conforming to the grooved profile of the contact surface. A contact may also be formed to gate electrode 290.

Figure 13:
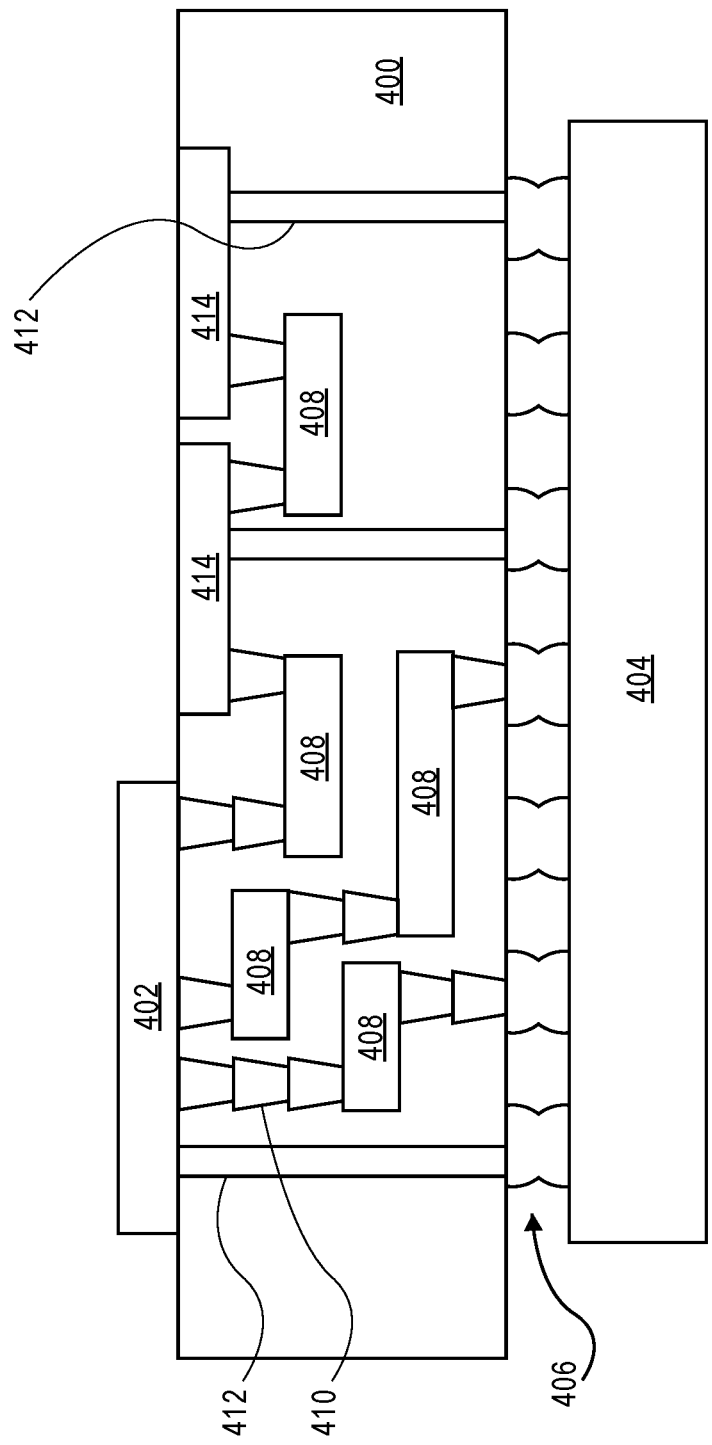
FIG. 13 is an interposer implementing one or more embodiments.

FIG. 13 illustrates interposer 400 that includes one or more embodiments. Interposer 400 is an intervening substrate used to bridge first substrate 402 to second substrate 404. First substrate 402 may be, for instance, an integrated circuit die including multigate transistor devices of the type described above. Second substrate 404 may be, for instance, a memory module, a computer motherboard, or another integrated circuit die. Generally, the purpose of interposer 400 is to spread a connection to a wider pitch or to reroute a connection to a different connection. For example, interposer 400 may connect an integrated circuit die to ball grid array (BGA) 406 that can subsequently be coupled to second substrate 404. In some embodiments, first and second substrates 402/404 are attached to opposing sides of interposer 400. In other embodiments, first and second substrates 402/404 are attached to the same side of interposer 400. In further embodiments, three or more substrates are interconnected by way of interposer 400.

Interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. Interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 400.

Figure 14:
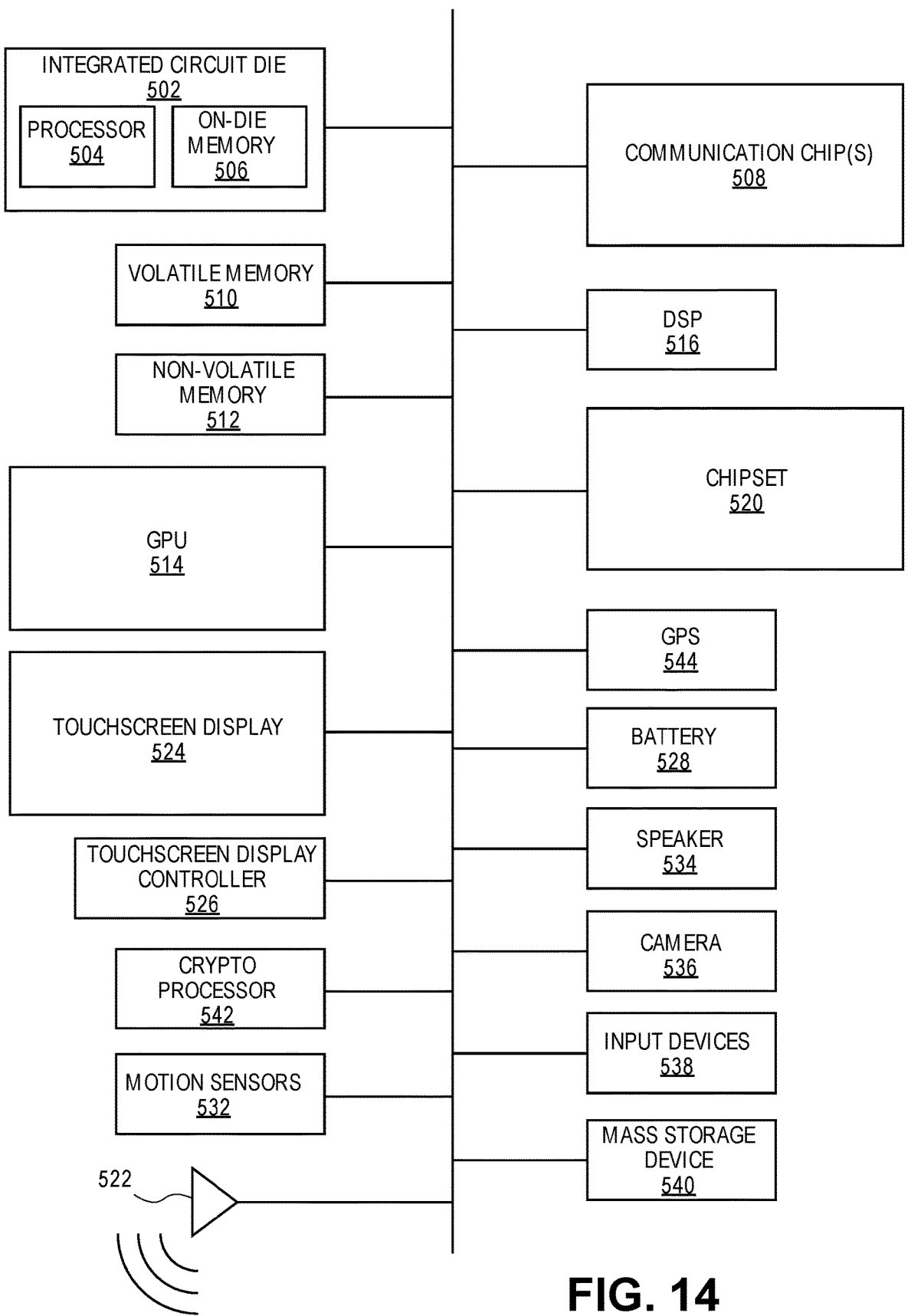
FIG. 14 illustrates an embodiment of a computing device.

FIG. 14 illustrates computing device 500 in accordance with one embodiment. Computing device 500 may include a number of components. In one embodiment, these components are attached to one or more motherboards. In an alternate embodiment, these components are fabricated onto a single system-on-a-chip (SoC) die rather than a motherboard. The components in computing device 500 include, but are not limited to, integrated circuit die 502 and at least one communication chip 508. In some implementations communication chip 508 is fabricated as part of integrated circuit die 502. Integrated circuit die 502 may include CPU 504 as well as on-die memory 506, often used as cache memory, that can be provided by technologies such as embedded DRAM (eDRAM) or spin-transfer torque memory (STTM or STTM-RAM).

Computing device 500 may include other components that may or may not be physically and electrically coupled to the motherboard or fabricated within an SoC die. These other components include, but are not limited to, volatile memory 510 (e.g., DRAM), non-volatile memory 512 (e.g., ROM or flash memory), graphics processing unit 514 (GPU), digital signal processor 516, crypto processor 542 (a specialized processor that executes cryptographic algorithms within hardware), chipset 520, antenna 522, display or touchscreen display 524, touchscreen controller 526, battery 528 or other power source, a power amplifier (not shown), global positioning system (GPS) device 544, compass 530, motion coprocessor or sensors 532 (that may include an accelerometer, a gyroscope, and a compass), speaker 534, camera 536, user input devices 538 (such as a keyboard, mouse, stylus, and touchpad), and mass storage device 540 (such as hard disk drive, compact disk (CD), digital versatile disk (DVD), and so forth).

Communications chip 508 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 508. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

Processor 504 of computing device 500 includes one or more devices, such as multigate transistors, that are formed in accordance with embodiments described above. The term "processor" may refer to any device or portion of a device that processes electronic data from registers and/or memory to transform that electronic data into other electronic data that may be stored in registers and/or memory.

Communication chip 508 may also include one or more devices, such as transistors, that are formed in accordance with embodiments.

In further embodiments, another component housed within computing device 500 may contain one or more devices, such as multigate transistors, that are formed in accordance with implementations.

In various embodiments, computing device 500 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 500 may be any other electronic device that processes data.

EXAMPLES

The following examples pertain to embodiments:

Example 1 is an apparatus including a transistor device disposed on a surface of a circuit substrate, the transistor device including a body including a height dimension, opposing sidewalls defining a width dimension and a length dimension defining a channel region between a source region and a drain region; and a gate stack on the body in the channel region, wherein at least one of the source region and the drain region of the body include a contact surface between the opposing sidewalls and the contact surface includes a profile such that a height dimension of the contact surface is greater at the sidewalls than at a point between the sidewalls.

In Example 2, the contact surface of the apparatus of Example 1 defines a groove between the opposing sidewalls such that a surface area of the contact surface between the sidewalls of each of the source region and the drain region of the body is greater than the surface area defined by the width dimension of the body without the groove.

In Example 3, the groove of the apparatus of Example 2 includes a shape of the letter V.

In Example 4, the channel region of the body of the apparatus of any of Examples 1-4 includes a Group III to Group V compound semiconductor material.

In Example 5, the channel region of the body of the apparatus of Example 4 includes indium-gallium-arsenide.

In Example 6, the body of the apparatus of any of Examples 1-5 is disposed on a buffer material.

In Example 7, the buffer material of the apparatus of Example 6 includes germanium or a Group III to Group V compound semiconductor material that is different than the channel material.

In Example 8, the gate stack of the apparatus of any of Examples 1-7 includes a gate electrode and a gate dielectric material wherein the gate dielectric material is disposed between the channel region and the gate electrode.

In Example 9, the profile of the body in the channel region of the apparatus of Example 7 is different than the profile of the body in the at least one of the source region and the drain region.

Example 10 is a method including forming a transistor device body on a circuit substrate, the transistor device body including a height dimension, opposing sidewalls defining a width dimension and a length dimension defining a channel region between a source region and a drain region; forming a groove in the body in at least one of the source region and the drain region; and forming a gate stack on the body in the channel region.

In Example 11, forming a groove of the method of Example 10 includes etching the body in the source region and the drain region In Example 12, the groove of the method of Example 10 or 11 includes a shape of the letter V.

In Example 13, the body of the method of any of Examples 10-12 includes a Group III to Group V compound semiconductor material.

In Example 14, the body of the method of Example 13 includes indium-gallium-arsenide.

In Example 15, the body of the method of any of Examples 10-14 is formed on a buffer material.

In Example 16, the profile of the body in the channel region of the method of Example 10 is different than a profile of the body in the at least one of the source region and the drain region.

Example 17 is a system including a computer including a processor coupled to a printed circuit board, the processor including transistor device circuitry in which a non-planar transistor device includes (1) a body including a height dimension, opposing sidewalls defining a width dimension including a contact surface between the opposing sidewalls and a length dimension defining a channel region between a source region and a drain region, wherein the contact surface of at least one of the source region and the drain region includes a groove; and (2) a gate stack on the contact surface of the channel region.

In Example 18, the body of the transistor device of the system of Example 17 is a Group III to Group V compound semiconductor material.

In Example 19, the body of the system of Example 18 includes indium-gallium-arsenide.

In Example 20, the groove of the system of Example 17 includes a shape of the letter V.

In Example 21, the profile of the body in the channel region of the system of Example 20 is different than a profile of the body in the at least one of the source region and the drain region.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
a transistor device disposed on a surface of a circuit substrate, the transistor device comprising:
a body comprising a height dimension, opposing sidewalls defining a width dimension and a length dimension defining a channel region between a source region and a drain region;
a gate stack on the body in the channel region, wherein at least one of the source region and the drain region of the body comprise a contact surface between the opposing sidewalls and the contact surface comprises a profile such that a height dimension of the contact surface is greater at the sidewalls than at a point between the sidewalls; and
a metal contact on the contact surface of the at least one of the source region and the drain region of the body.

2. The apparatus of claim 1, wherein the contact surface defines a groove between the opposing sidewalls such that a surface area of the contact surface between the sidewalls of each of the source region and the drain region of the body is greater than the surface area defined by the width dimension of the body without the groove.

3. The apparatus of claim 2, wherein the groove comprises a shape of the letter V.

4. The apparatus of claim 1, wherein the channel region of the body comprises a Group III to Group V compound semiconductor material.

5. The apparatus of claim 4, wherein the channel region of the body comprises indium-gallium-arsenide.

6. The apparatus of claim 1, wherein the body is disposed on a buffer material.

7. The apparatus of claim 6, wherein the buffer material comprises germanium or a Group III to Group V compound semiconductor material that is different than the channel material.

8. The apparatus of claim 1, wherein the gate stack comprises a gate electrode and a gate dielectric material wherein the gate dielectric material is disposed between the channel region and the gate electrode.

9. The apparatus of claim 7, wherein a profile of the body in the channel region is different than the profile of the body in the at least one of the source region and the drain region.

10. A method comprising:
forming a transistor device body on a circuit substrate, the transistor device body comprising a height dimension, opposing sidewalls defining a width dimension and a length dimension defining a channel region between a source region and a drain region;
forming a groove in the body in at least one of the source region and the drain region;
forming a gate stack on the body in the channel region; and
forming a metal contact on the groove in the body in the at least one of the source region and the drain region.

11. The method of claim 10, wherein forming a groove comprises etching the body in the source region and the drain region.

12. The method of claim 10, wherein the groove comprises a shape of the letter V.

13. The method of claim 10, wherein the body comprises a Group III to Group V compound semiconductor material.

14. The method of claim 13, wherein the body comprises indium-gallium-arsenide.

15. The method of claim 10, wherein the body is formed on a buffer material.

16. The method of claim 10, wherein a profile of the body in the channel region is different than a profile of the body in the at least one of the source region and the drain region.

17. A system comprising:
a computer comprising a processor coupled to a printed circuit board, the processor comprising transistor device circuitry in which a non-planar transistor device comprises
(1) a body comprising a height dimension, opposing sidewalls defining a width dimension comprising a contact surface between the opposing sidewalls and a length dimension defining a channel region between a source region and a drain region, wherein the contact surface of at least one of the source region and the drain region comprises a groove;
(2) a gate stack on the contact surface of the channel region; and
(3) a metal contact on the contact surface of the at least one of the source region and the drain region of the body.

18. The system of claim 17, wherein the body of the transistor device is a Group III to Group V compound semiconductor material.

19. The system of claim 18, wherein the body comprises indium-gallium-arsenide.

20. The system of claim 17, wherein the groove comprises a shape of the letter V.

21. The system of claim 20, wherein a profile of the body in the channel region is different than a profile of the body in the at least one of the source region and the drain region.

* * * * *